(12) United States Patent
Han

(10) Patent No.: US 7,277,289 B2
(45) Date of Patent: Oct. 2, 2007

(54) RESISTOR FOR CONTROLLING A FAN MOTOR ROTATING SPEED FOR USE IN AN AIR CONDITIONER

(75) Inventor: Heung-soo Han, Cheonan-Si (KR)

(73) Assignee: JS Tech Co, Ltd., Cheonan-si (KR)

( * ) Notice: Subject to any disclaimer, the term of this patent is extended or adjusted under 35 U.S.C. 154(b) by 7 days.

(21) Appl. No.: 11/399,587

(22) Filed: Apr. 6, 2006

(65) Prior Publication Data

US 2006/0256493 A1 Nov. 16, 2006

(30) Foreign Application Priority Data

Apr. 13, 2005 (KR) ...................... 20-2005-0010152
Apr. 13, 2005 (KR) ...................... 20-2005-0010157

(51) Int. Cl.
H05K 7/20 (2006.01)
H01C 13/00 (2006.01)
H01C 1/08 (2006.01)
F04B 49/06 (2006.01)
H02H 5/04 (2006.01)

(52) U.S. Cl. .......................... 361/707; 338/50; 338/52; 417/45; 361/104

(58) Field of Classification Search ........ 361/103–104, 361/707; 338/50–53, 179, 198–200, 215, 338/220–221, 260, 325; 417/32, 45; 337/414
See application file for complete search history.

(56) References Cited

U.S. PATENT DOCUMENTS

| | | | | |
|---|---|---|---|---|
| 4,935,717 A * | 6/1990 | Osawa et al. | ................... | 338/51 |
| 5,000,662 A * | 3/1991 | Yamamoto et al. | ............ | 417/32 |
| 5,192,937 A * | 3/1993 | Lee | ............... | 337/104 |
| 5,192,940 A * | 3/1993 | Yajima et al. | ............... | 338/308 |
| 5,229,741 A * | 7/1993 | Black, III | .................... | 338/50 |
| 5,291,174 A * | 3/1994 | Zirnheld et al. | ............... | 338/24 |
| 5,408,575 A * | 4/1995 | Morris | ........................ | 388/830 |
| 5,550,527 A * | 8/1996 | Lee | ............................... | 338/50 |
| 5,703,561 A * | 12/1997 | Yamamoto et al. | ........... | 338/53 |
| 5,770,993 A * | 6/1998 | Miyazawa et al. | .......... | 337/160 |
| 5,859,581 A * | 1/1999 | Morris | ........................ | 338/50 |
| 6,018,288 A * | 1/2000 | Waite et al. | ................. | 338/254 |
| 6,069,553 A * | 5/2000 | Black et al. | ................. | 338/215 |
| 6,747,543 B2 * | 6/2004 | Lim | ............................ | 338/50 |

FOREIGN PATENT DOCUMENTS

| | | | | |
|---|---|---|---|---|
| DE | 4117276 | A | * | 12/1992 |
| JP | 10211812 | A | * | 8/1998 |
| KR | 2001112119 | A | * | 12/2001 |

* cited by examiner

*Primary Examiner*—Jayprakash Gandhi
*Assistant Examiner*—Robert J. Hoffberg
(74) *Attorney, Agent, or Firm*—Ladas & Parry LLC

(57) ABSTRACT

Provided is a resistor for controlling a fan motor rotating speed for use in an air conditioner. The resistor comprises a base body, a radiator attached to a top portion of the base body, a printed resistor circuit board covered with insulating sheets and received within the radiator, a fixture plate placed on a front surface of the radiator to isolate the printed resistor circuit board from the outside, and a temperature fuse spot-welded to upper connecting tip ends of the printed resistor circuit board at a top portion of the radiator. A fastener portion of an arc shape is formed on a top portion of the fixture plate to wrap around and fixedly support the temperature fuse. This reduces the manufacturing cost of the resistor, while improving the manufacturability and reliability thereof.

3 Claims, 5 Drawing Sheets

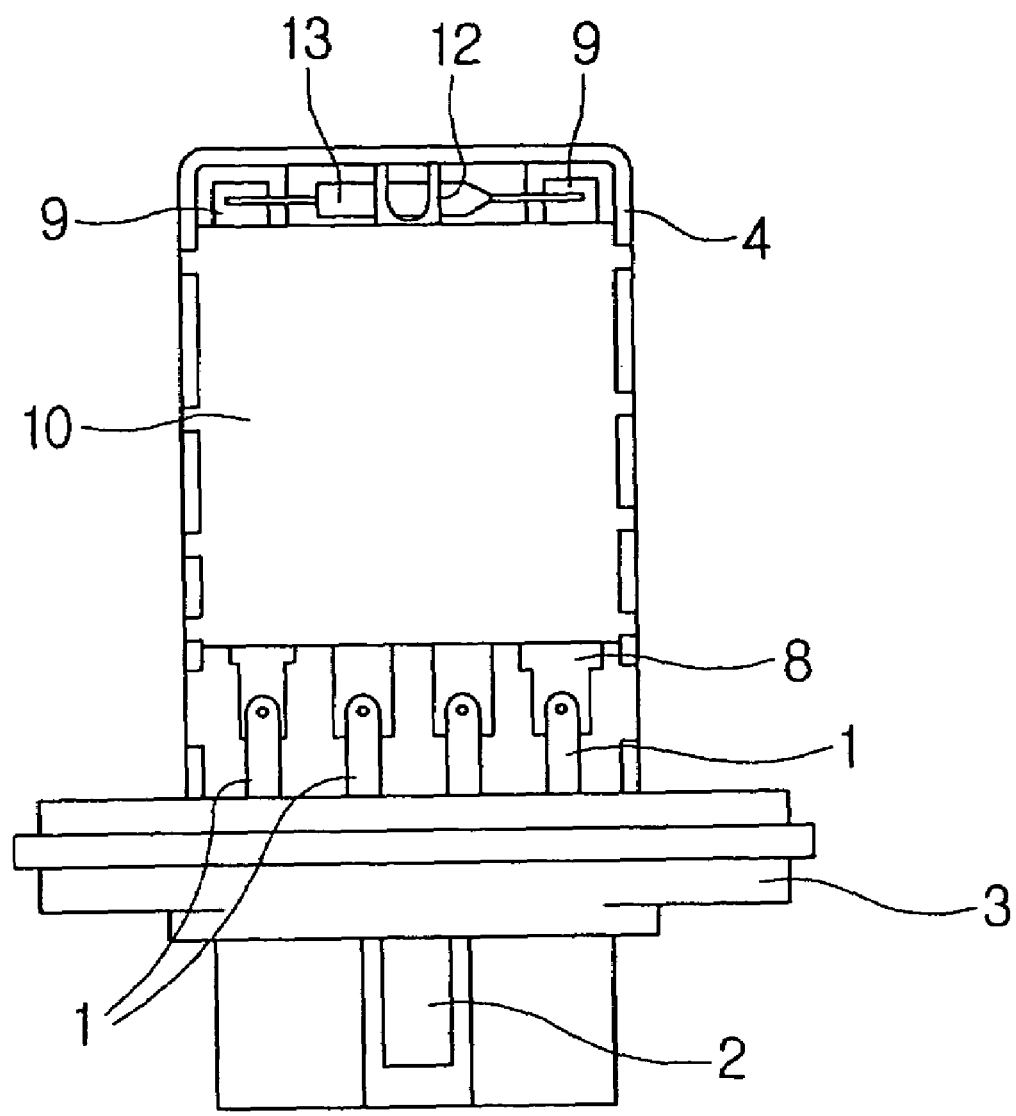
[Fig1]

[Fig2]
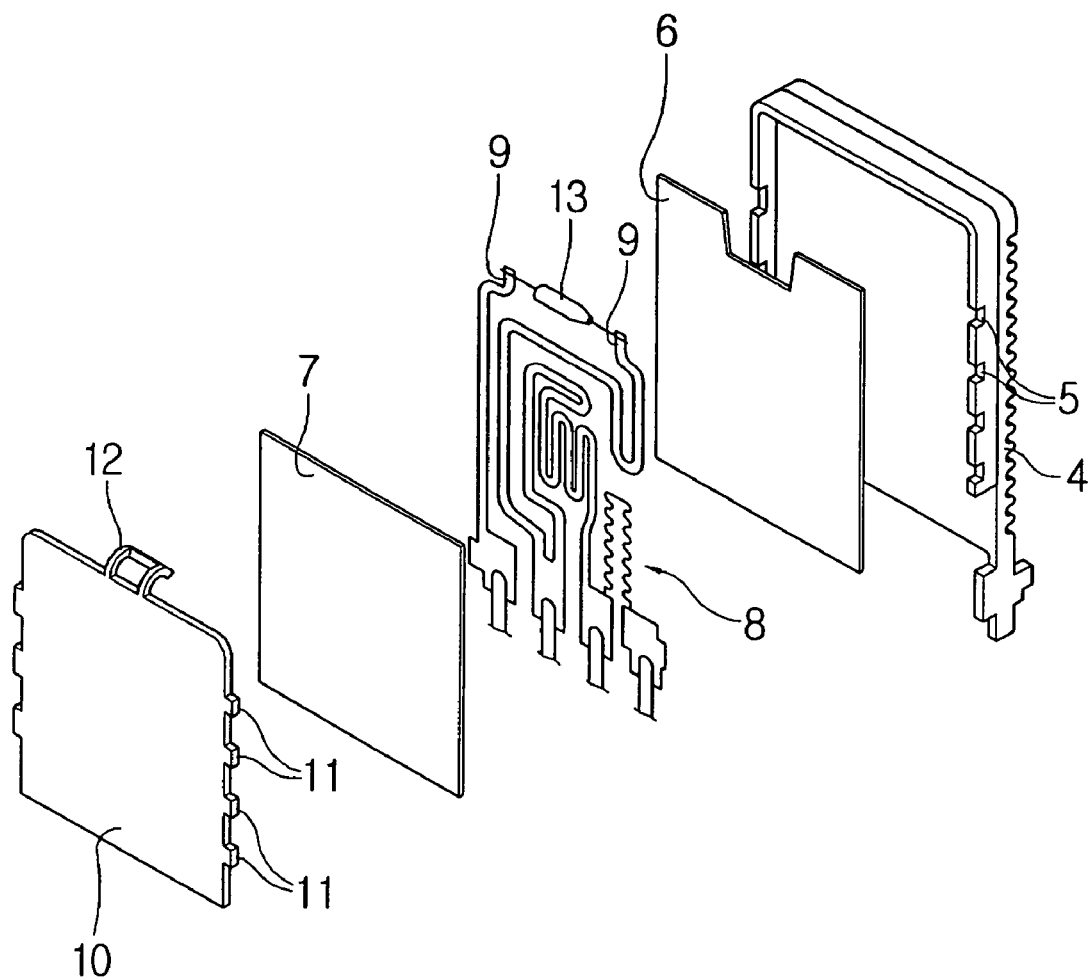

[Fig3]
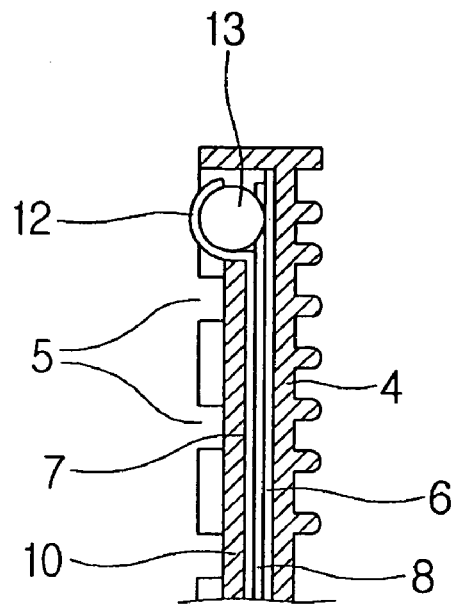
[Fig4]
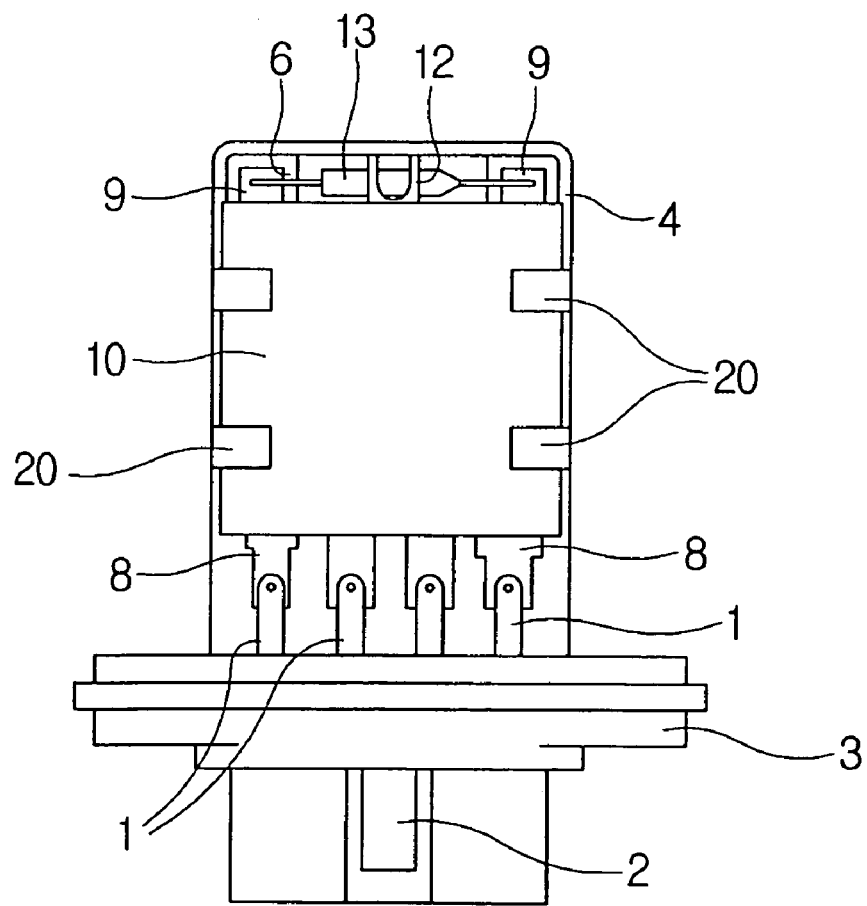

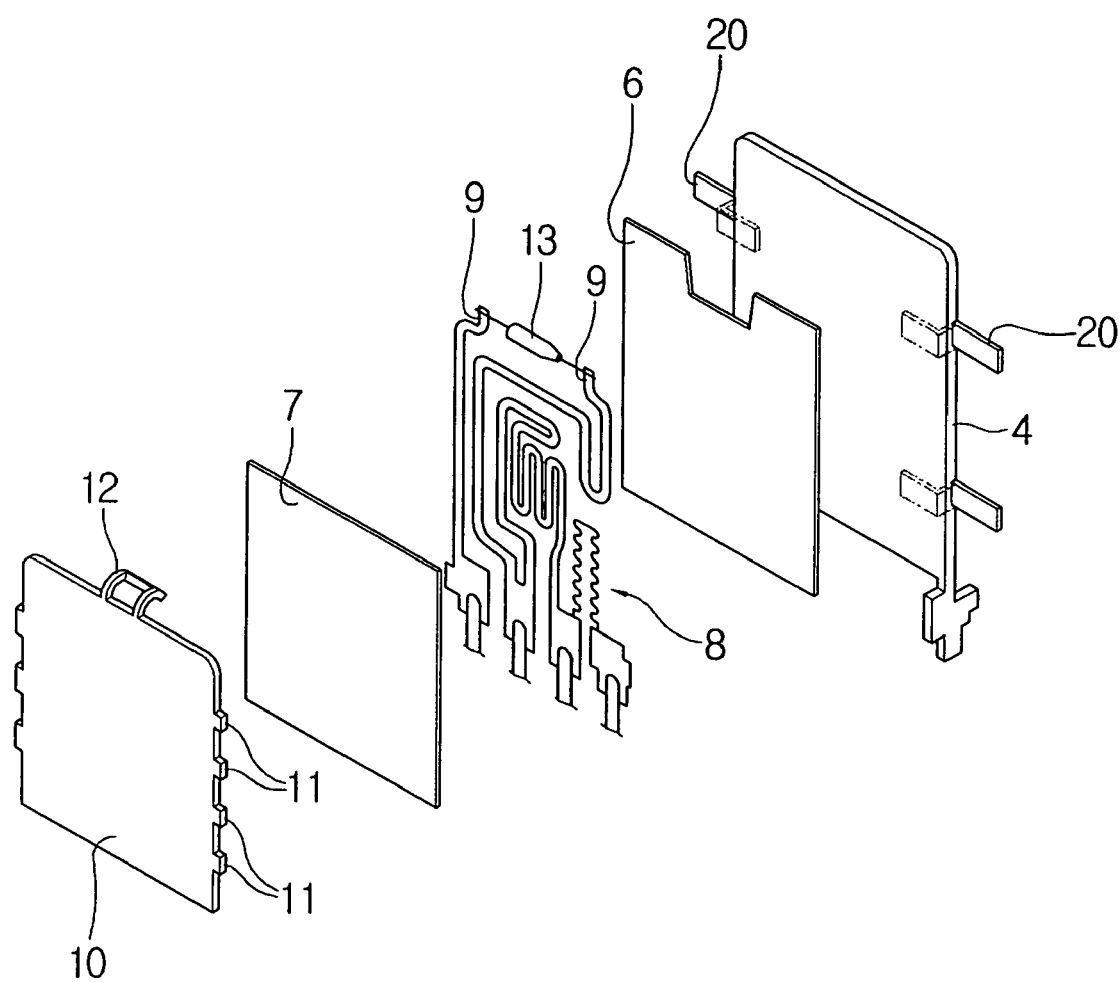
[Fig5]

[Fig6]
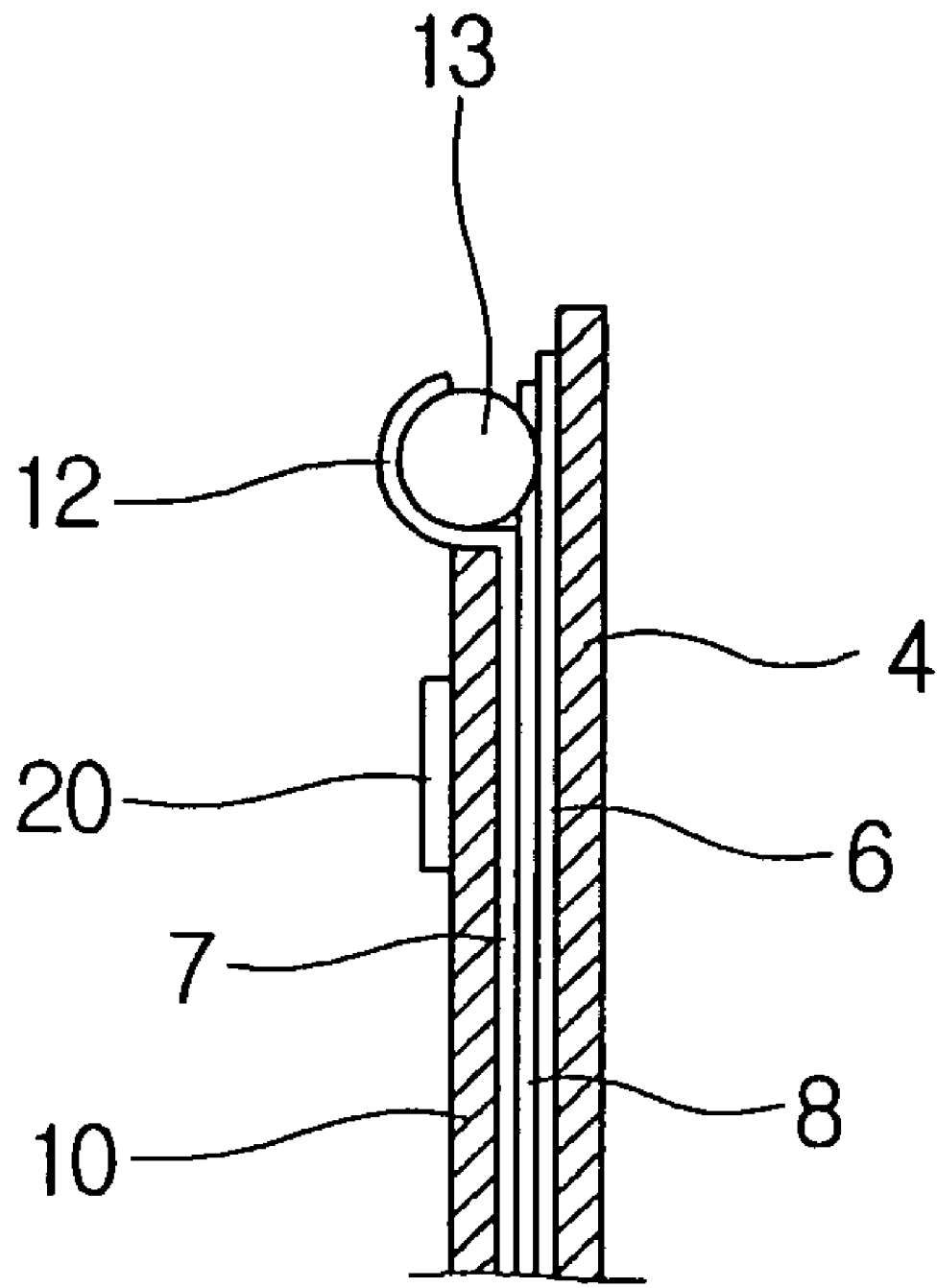

RESISTOR FOR CONTROLLING A FAN MOTOR ROTATING SPEED FOR USE IN AN AIR CONDITIONER

BACKGROUND OF THE INVENTION

1. Field of the Invention

The present invention pertains to a resistor for controlling a fan motor rotation speed for use in an air conditioner.

2. Description of the Related Art

Conventional automotive vehicles are necessarily provided with a cooler or a heater for air-conditioning purpose. The cold or hot air generated from the cooler or heater is forcibly supplied to a passenger room of the vehicle under the action of a motor-driven fan.

Such an air conditioning system is constructed such that a driver can regulate the intensity of the cold or hot air into three to four steps, e.g., a breeze, a moderate wind and a strong wind, in an effort to optimize the room temperature of the vehicle.

The stepwise regulation of the air intensity becomes available by setting the rotation speed of the fan as an air supplying means, i.e., the rotational speed of the motor as a fan driving means, on a step-by-step basis. In this regard, a resistor is used as a means for controlling the motor.

The resistor employed for the purpose includes a radiator for radiating the heat generated when in operation, a base body for receiving step-based connector terminals and a main connector terminal, and a printed circuit board of a thin plate shape mounted within the radiator. A temperature fuse is spot-welded to an end of the printed circuit board and plays a role of a power cut-off means that disconnects electric power from the motor when a surge current flows through the printed circuit board due to the occurrence of an abnormal condition such as a failure of the motor or the like.

However, the conventional temperature fuse poses a problem in that it is highly likely to be separated from its position when subjected to an external shock. This is because the temperature fuse is merely attached to the end of the printed circuit board by spot-welding. Such problem takes place more often if the temperature fuse is attached on the top of the radiator and exposed to the outside, as is the case in recent automotive vehicles.

SUMMARY OF THE INVENTION

In view of the shortcomings inherent in the prior art noted above, it is an object of the present invention to provide a resistor for controlling a fan motor rotation speed for use in an air conditioner that can firmly secure, with a fastener portion provided on the top of a fixture plate, a temperature fuse for cutting off the power supply at the time of occurrence of an abnormality in a fan driving motor, thereby improving the mountability of the temperature fuse, can make a product incorporating the resistor lightweight and less costly to manufacture by employing a radiator plate of a sheet shape, and can enhance manufacturability and reliability of a product by simply affixing the resistor with a bendable clip portion provided on the radiator plate.

In order to achieve the object of the present invention, one aspect of the present invention is directed to a resistor for controlling a fan motor rotation speed for use in an air conditioner comprising a base body, a radiator attached to a top portion of the base body, a printed resistor circuit board covered with insulating sheets and received within the radiator, a fixture plate placed on a front surface of the radiator to isolate the printed resistor circuit board from the outside, and a temperature fuse spot-welded to upper connecting tip ends of the printed resistor circuit board at a top portion of the radiator, wherein a fastener portion of an arc shape is formed on a top portion of the fixture plate to wrap around and fixedly support the temperature fuse.

Another aspect of the present invention is directed to a resistor assembly for controlling a fan motor rotation speed for use in an air conditioner comprising a base body, a radiator plate attached to a top portion of the base body, a printed resistor circuit board covered with insulating sheets and brought into contact with the radiator plate, a fixture plate placed on a front surface of the radiator plate to isolate the printed resistor circuit board from the outside, and a temperature fuse spot-welded to upper connecting tip ends of the printed resistor circuit board at a top portion of the radiator plate, wherein the radiator plate is of a sheet shape and has a plurality of bendable clip portions at lateral edges of the radiator plate, and wherein the clip portions are bent in such a manner as to secure the printed resistor circuit board and the fixture plate to the radiator plate.

BRIEF DESCRIPTION OF THE DRAWINGS

The above and other objects, features and advantages of the present invention will become apparent from the following description of preferred embodiments given in conjunction with the accompanying drawings, in which:

FIG. 1 is a front elevational view showing a resistor for controlling a fan motor rotation speed for use in an air conditioner according to a first embodiment of the present invention;

FIG. 2 is a partial exploded perspective view of the resistor of the first embodiment shown in FIG. 1;

FIG. 3 is a partial cross-sectional view of the resistor of the first embodiment shown in FIG. 1, with parts thereof combined together;

FIG. 4 a front elevational view showing a resistor for controlling a fan motor rotation speed for use in an air conditioner according to a second embodiment of the present invention;

FIG. 5 is a partial exploded perspective view of the resistor of the second embodiment shown in FIG. 4; and FIG. 6 is a partial cross-sectional view of the resistor of the second embodiment shown in FIG. 1, with parts thereof combined together.

DETAILED DESCRIPTION OF THE INVENTION

Hereinbelow, preferred embodiments of the present invention will be described in detail with reference to FIGS. 1 through 6.

Referring first to FIGS. 1 through 3 which are directed to a first embodiment of the invention, a resistor for controlling a fan motor rotation speed includes a base body 3 that receives a plurality of step-based power connecting terminals 1 and a main power connecting terminal 2. Mounted on the top of the base body 3 is a radiator 4 having a plurality of radiator fins, on the opposite sides of which are formed a plurality of coupling recesses 5.

A printed resistor circuit board 8 of a sheet shape is connected to the step-based power connecting terminals 1 and the main power connecting terminal 2. The printed resistor circuit board 8 is covered with insulating sheets 6 and 7 at its front and rear surfaces and received within the radiator 4.

Disposed between and spot-welded to connecting tip ends 9 extending to above the printed resistor circuit board 8 is a temperature fuse 13 that serves to cut off the power supply at the time when a fan driving motor is out of order. The temperature fuse 13 is disposed in the upper space of the radiator 4 and therefore remains exposed to the outside even though a fixture plate 10 set forth below will be coupled to the radiator 4.

In the meantime, the fixture plate 10 is adapted to isolate the printed resistor circuit board 8 from the outside and has at its lateral sides a plurality of coupling protrusions 11 that are inserted into the coupling recesses 5 of the radiator 4. Accordingly, the printed resistor circuit board 8 is isolated from the outside as the fixture plate 10 coupled to the front surface of the radiator 4.

According to the present invention, a fastener portion 12 of an arc shape is attached to the top of the fixture plate 10 to fixedly support the temperature fuse 13. As shown in FIGS. 2 and 3, the fastener portion 12 protrudes upwardly from the top center portion of the fixture plate 10 and is shaped to wrap around the body portion of the temperature fuse 13.

As a result, if the fixture plate 10 is coupled to the front surface of the radiator 4, the fastener portion 12 is pressed against and firmly supports the body portion of the temperature fuse 13 as best illustrated in FIG. 3. This prevents the temperature fuse 13 from being separated from the connecting tip ends 9 even when a strong shock is applied thereto.

Thank to such a configuration and operation of the present invention, the resistor can enjoy an enhanced anti-shock property as a whole, thus enabling the temperature fuse to cut off the power supply with increased reliability in the event that the fan driving motor is out of order.

Referring now to FIGS. 4 through 6 which are directed to a second embodiment of the invention, a resistor for controlling a fan motor rotation speed includes a base body 3 that receives a plurality of step-based power connecting terminals 1 and a main power connecting terminal 2. Mounted on the top of the base body 3 is a radiator plate 4 having a plurality of radiator fins, which radiator plate 4 is of a sheet shape and has a plurality of bendable clip portions 20 projecting laterally outwardly from its lateral edges. The bendable clip portions 20 can be bent back generally 180 degrees at the time of combining the components of the resistor together, thereby ensuring that the printed resistor circuit board 8 and the fixture plate 10 are fixedly secured to the radiator plate 4.

A printed resistor circuit board 8 of a sheet shape is connected to the step-based power connecting terminals 1 and the main power connecting terminal 2. The printed resistor circuit board 8 is covered with insulating sheets 6 and 7 at its front and rear surfaces and brought into close contact with one surface of the radiator plate 4.

Disposed between and spot-welded to connecting tip ends 9 which extend to above the printed resistor circuit board 8 is a temperature fuse 13 that serves to cut off the power supply at the time when a fan driving motor is out of order. The temperature fuse 13 is disposed in the upper space of the radiator plate 4 and therefore remains exposed to the outside even though a fixture plate 10 will be coupled to the radiator plate 4.

In the meantime, the fixture plate 10 is adapted to isolate the printed resistor circuit board 8 from the outside. A fastener portion 12 of an arc shape is attached to the top of the fixture plate 10 to fixedly support the temperature fuse 13. As clearly shown in FIGS. 5 and 6, the fastener portion 12 protrudes upwardly from the top center portion of the fixture plate 10 and is shaped to wrap around the body portion of the temperature fuse 13.

As a result, if the fixture plate 10 is coupled to the front surface of the radiator plate 4, the fastener portion 12 is pressed against and firmly supports the body portion of the temperature fuse 13 as best illustrated in FIG. 6. This prevents the temperature fuse 13 from being separated from the connecting tip ends 9 even when a strong shock is applied thereto.

Description will now be given to the operations and advantageous effects of the resistor described above.

In order to fabricate the resistor, the printed resistor circuit board 8 covered with the insulating sheets 6 and 7 are brought into contact with the front surface of the radiator plate 4 in a condition that the bendable clip portions 20 remains unfolded. The fixture plate 10 is then placed over the printed resistor circuit board 8 one atop above.

Thereafter, the bendable clip portions 20 is bent back over the fixture plate 10 as shown by phantom lines in FIG. 5, thus causing the fixture plate 10 and the printed resistor circuit board 8 to be firmly secured to the radiator plate 4.

During the time when the fixture plate 10 and the printed resistor circuit board 8 are secured to the radiator plate 4, the fastener portion 12 provided on the top of the fixture plate 10 is adapted to press and support the body portion of the temperature fuse 13 spot-welded to the connecting tip ends 9 of the printed resistor circuit board 8. This prevents the temperature fuse 13 from being inadvertently separated from the connecting tip ends 9 even when a strong shock is applied thereto.

According to the present invention set forth above, it becomes possible to make a product incorporating the resistor lightweight and less costly to manufacture by employing the radiator plate 4 of a sheet shape. Furthermore, it is possible to reduce the steps of fabrication and thereby to enhance the manufacturability of a product, because the printed resistor circuit board 8 and the fixture plate 10 are secured to the radiator plate 4 by simply bending the bendable clip portions 20.

Moreover, thank to the fact that the temperature fuse 13 is firmly supported by the fastener portion 12 formed on the top portion of the fixture plate 10, the resistor can enjoy an enhanced anti-shock property as a whole, thus enabling the temperature fuse 13 to cut off the power supply with increased reliability in the event that the fan driving motor is out of order.

As is apparent in the foregoing, the present invention provides a resistor wherein a temperature fuse is spot-welded to upper connecting tip ends of a printed resistor circuit board within a radiator and wherein a fastener portion 12 of an arc shape is formed on the top portion of a fixture plate to press and fixedly support the body portion of the temperature fuse. This makes it possible to firmly secure, with the fastener portion provided on the top of the fixture plate, the temperature fuse for cutting off the power supply at the time of occurrence of an abnormality in a fan driving motor, thereby improving the mountability of the temperature fuse and the reliability of the resistor for controlling a fan motor rotation speed for use in an air conditioner.

Although certain preferred embodiments of the present invention have been described hereinabove, it will be apparent to those skilled in the art that various changes or modifications may be made thereto within the scope of the invention defined by the appended claims.

What is claimed is:

1. A resistor for controlling a fan motor rotating speed for use in an air conditioner comprising a base body, a radiator attached to a top portion of the base body, a printed resistor circuit board covered with insulating sheets and received within the radiator, a fixture plate placed on a front surface of the radiator to isolate the printed resistor circuit board from the outside, and a temperature fuse spot-welded to upper connecting tip ends of the printed resistor circuit board at a top portion of the radiator, wherein a fastener portion of an arc shape is formed on a top portion of the fixture plate to wrap around and fixedly support the temperature fuse.

2. A resistor assembly for controlling a fan motor rotating speed for use in an air conditioner comprising a base body, a radiator plate attached to a top portion of the base body, a printed resistor circuit board covered with insulating sheets and brought into contact with the radiator plate, a fixture plate placed on a front surface of the radiator plate to isolate the printed resistor circuit board from the outside, and a temperature fuse spot-welded to upper connecting tip ends of the printed resistor circuit board at a top portion of the radiator plate, wherein the radiator plate is of a sheet shape and has a plurality of bendable clip portions at lateral edges of the radiator plate, and wherein the clip portions are bent in such a manner as to secure the printed resistor circuit board and the fixture plate to the radiator plate.

3. The resistor assembly as recited in claim 2, wherein a fastener portion of an arc shape is formed on a top portion of the fixture plate to wrap around and fixedly support the temperature fuse.

* * * * *